US009548239B2

(12) United States Patent
Lu et al.

(10) Patent No.: US 9,548,239 B2
(45) Date of Patent: Jan. 17, 2017

(54) METHOD FOR FABRICATING CONTACT PLUG IN AN INTERLAYER DIELECTRIC LAYER

(71) Applicant: UNITED MICROELECTRONICS CORP., Hsin-Chu (TW)

(72) Inventors: Chia-Lin Lu, Taoyuan (TW); Chun-Lung Chen, Tainan (TW); Feng-Yi Chang, Tainan (TW); Ching-Wen Hung, Tainan (TW); Jia-Rong Wu, Kaoshsiung (TW); Yi-Hui Lee, Taipei (TW); Yi-Kuan Wu, Kaohsiung (TW); Ying-Cheng Liu, Tainan (TW); Chih-Sen Huang, Tainan (TW); Yi-Wei Chen, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 115 days.

(21) Appl. No.: 14/612,235

(22) Filed: Feb. 2, 2015

(65) Prior Publication Data

US 2016/0225662 A1 Aug. 4, 2016

(51) Int. Cl.
*H01L 21/76* (2006.01)
*H01L 21/768* (2006.01)

(52) U.S. Cl.
CPC ... *H01L 21/76802* (2013.01); *H01L 21/76879* (2013.01)

(58) Field of Classification Search
CPC .............. H01L 21/76802; H01L 21/76879; H01L 21/768; H01L 21/76801; H01L 21/76808; H01L 21/76877; H01L 21/02107
See application file for complete search history.

(56) References Cited

U.S. PATENT DOCUMENTS

| 6,184,075 | B1 * | 2/2001 | Kim | H01L 27/10894 257/E21.648 |
| 6,297,149 | B1 | 10/2001 | Stamper | |
| 8,062,971 | B2 | 11/2011 | Riess et al. | |
| 8,501,629 | B2 * | 8/2013 | Tang | H01J 37/32357 216/22 |
| 9,263,382 | B2 * | 2/2016 | Yang | H01L 21/76898 |
| 2006/0216926 | A1 | 9/2006 | Ye et al. | |
| 2008/0076244 | A1 * | 3/2008 | Ye | H01L 21/31144 438/597 |
| 2013/0134505 | A1 * | 5/2013 | Kobayashi | H01L 29/66348 257/330 |
| 2014/0346575 | A1 * | 11/2014 | Chen | H01L 21/76897 257/288 |

* cited by examiner

*Primary Examiner* — Scott B Geyer
(74) *Attorney, Agent, or Firm* — Winston Hsu; Scott Margo

(57) ABSTRACT

A gate structure is first formed on a substrate and an interlayer dielectric (ILD) layer is formed around the gate structure, a dielectric layer is formed on the ILD layer and the gate structure, an opening is formed in the dielectric layer and the ILD layer, and an organic dielectric layer (ODL) is formed on the dielectric layer and in the opening. After removing part of the ODL, part of the dielectric layer to extend the opening, and then the remaining ODL, a contact plug is formed in the opening.

7 Claims, 6 Drawing Sheets

US 9,548,239 B2

METHOD FOR FABRICATING CONTACT PLUG IN AN INTERLAYER DIELECTRIC LAYER

BACKGROUND OF THE INVENTION

1. Field of the Invention

The invention relates to a method for fabricating semiconductor device, and more particularly, to a method of forming contact plugs.

2. Description of the Prior Art

In current semiconductor industry, polysilicon has been widely used as a gap-filling material for fabricating gate electrode of metal-oxide-semiconductor (MOS) transistors. However, the conventional polysilicon gate also faced problems such as inferior performance due to boron penetration and unavoidable depletion effect which increases equivalent thickness of gate dielectric layer, reduces gate capacitance, and worsens driving force of the devices. In replacing polysilicon gates, work function metals have been developed to serve as a control electrode working in conjunction with high-K gate dielectric layers.

However, in current fabrication of high-k metal transistor, particularly during the stage when contact holes are formed adjacent to the metal gates, phenomenon such as bowing profile occurring on contact holes is often observed. This induces poor adhesion as well as poor gap-fill for metal layers later to be deposited into the contact holes. Hence, how to resolve this issue has become an important task in this field.

SUMMARY OF THE INVENTION

According to a preferred embodiment of the present invention, a method for fabricating semiconductor device is disclosed. The method includes the steps of: providing a substrate having a gate structure thereon and an interlayer dielectric (ILD) layer around the gate structure; forming a dielectric layer on the ILD layer and the gate structure; forming an opening in the dielectric layer and the ILD layer; forming an organic dielectric layer (ODL) on the dielectric layer and in the opening; removing part of the ODL; removing part of the dielectric layer for extending the opening; removing the remaining ODL; and forming a contact plug in the opening.

According to another aspect of the present invention, a method for fabricating semiconductor device is disclosed. The method includes the steps of: providing a substrate having a gate structure thereon and an interlayer dielectric (ILD) layer around the gate structure; forming a dielectric layer on the ILD layer and the gate structure; forming a hard mask on the dielectric layer; performing a first etching process to remove part of the hard mask and part of the dielectric layer for forming a first opening; performing a second etching process to remove part of the dielectric layer and ILD layer for forming a second opening; and forming a contact plug in the opening.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
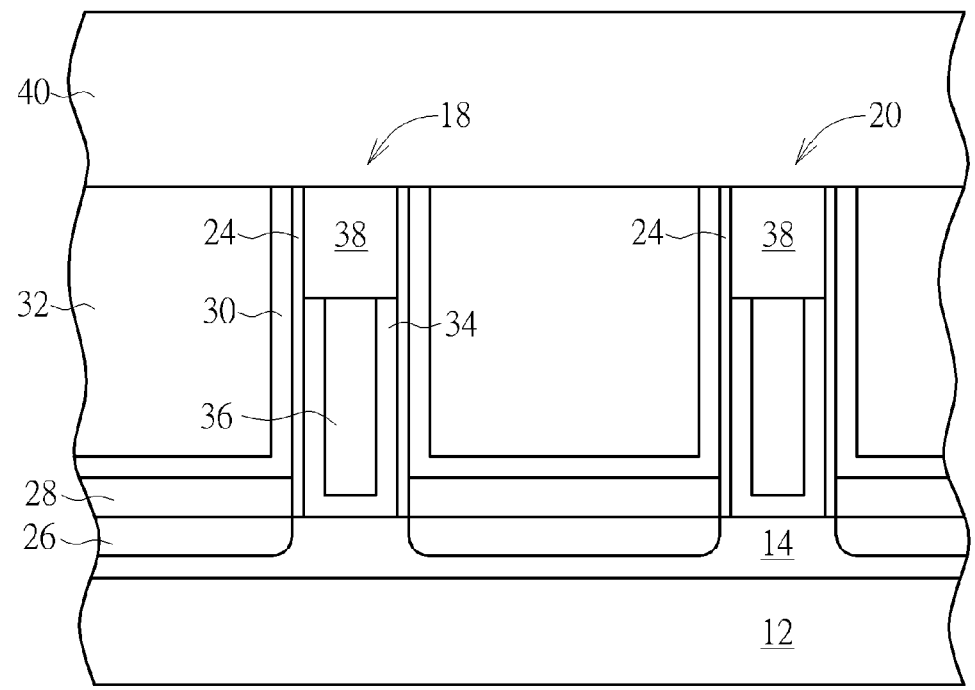
FIGS. 1-6 illustrate a method for fabricating semiconductor device according to a preferred embodiment of the present invention.

Referring to FIGS. 1-6, FIGS. 1-6 illustrate a method for fabricating semiconductor device according to a preferred embodiment of the present invention. As shown in FIG. 1, a substrate 12, such as a silicon substrate or silicon-on-insulator (SOI) substrate is provided. At least a first fin-shaped structure 14 and an insulating layer (not shown) are formed on the substrate 12, in which the bottom of the fin-shapes structure 14 is preferably enclosed by the insulating layer, such as silicon oxide to form a shallow trench isolation (STI). A plurality of gate structures 18, 20 are formed on part of the fin-shaped structure 14. It should be noted that even though two gate structures are disclosed in this embodiment, the quantity of the gate structures is not limited to two, but could by any quantity depending on the demand of the product.

The formation of the fin-shaped structure 14 could be accomplished by first forming a patterned mask (now shown) on the substrate, 12, and an etching process is performed to transfer the pattern of the patterned mask to the substrate 12. Next, depending on the structural difference of a tri-gate transistor or dual-gate fin-shaped transistor being fabricated, the patterned mask could be stripped selectively or retained, and deposition, chemical mechanical polishing (CMP), and etching back processes are carried out to form an insulating layer surrounding the bottom of the fin-shaped structure 14. Alternatively, the formation of the fin-shaped structure 14 could also be accomplished by first forming a patterned hard mask (not shown) on the substrate 12, and then performing an epitaxial process on the exposed substrate 12 through the patterned hard mask to grow a semiconductor layer. This semiconductor layer could then be used as the corresponding fin-shaped structure 14. In another fashion, the patterned hard mask could be removed selectively or retained, and deposition, CMP, and then etching back could be used to form an insulating layer to surround the bottom of the fin-shaped structure 14. Moreover, if the substrate 12 were a SOI substrate, a patterned mask could be used to etch a semiconductor layer on the substrate until reaching a bottom oxide layer underneath the semiconductor layer to form the corresponding fin-shaped structure. If this means is chosen the aforementioned steps for fabricating the insulating layer could be eliminated.

The fabrication of the gate structures 18 and 20 could be accomplished by a gate first process, a high-k first approach from gate last process, or a high-k last approach from gate last process. Since this embodiment pertains to a high-k first approach, dummy gates (not shown) composed of high-k dielectric layer and polysilicon material could be first formed on the fin-shaped structure 14 and the insulating layer, and a spacer 24 is formed on the sidewall of the dummy gates. A source/drain region 26 and epitaxial layer 28 are then formed on the fin-shaped structure 14 and/or substrate 12 adjacent to two sides of the spacer 24, a contact etch stop layer (CESL) 30 is formed on the dummy gates, and an interlayer dielectric (ILD) layer 32 composed of tetraethyl orthosilicate (TEOS) is formed on the CESL 30.

Next, a replacement metal gate (RMG) process could be conducted to planarize part of the ILD layer 32 and CESL 30 and then transforming the dummy gate into metal gates. The RMG process could be accomplished by first performing a selective dry etching or wet etching process, such as using etchants including ammonium hydroxide (NH$_4$OH) or tetramethylammonium hydroxide (TMAH) to remove the polysilicon layer from dummy gates for forming a recess (not shown) in the ILD layer 32. Next, a conductive layer including at least a U-shaped work function metal layer 34 and a low resistance metal layer 36 is formed in the recess, and a planarizing process is conducted so that the surface of the U-shaped work function layer 34 and low resistance metal layer 36 is even with the surface of the ILD layer 32.

In this embodiment, the work function metal layer 34 is formed for tuning the work function of the later formed metal gates to be appropriate in an NMOS or a PMOS. For an NMOS transistor, the work function metal layer 34 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 34 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 34 and the low resistance metal layer 36, in which the material of the barrier layer may include titanium (Ti), titanium nitride (TiN), tantalum (Ta) or tantalum nitride (TaN). Furthermore, the material of the low-resistance metal layer 36 may include copper (Cu), aluminum (Al), titanium aluminum (TiAl), cobalt tungsten phosphide (CoWP) or any combination thereof. Since the process of using RMG process to transform dummy gate into metal gate is well known to those skilled in the art, the details of which are not explained herein for the sake of brevity.

After forming the gate structures 18 and 20, part of the work function metal layer 34 and low resistance metal layer 36 could be removed, and a hard mask 38 is formed on the work function metal layer 34 and the low resistance metal layer 36. The hard mask 38 could be a single material layer or composite material layer, such as a composite layer containing both silicon oxide and silicon nitride. A dielectric layer 40 is then formed on the ILD layer 32 and the gate structures 18 and 20, in which the dielectric layer 40 is preferably composed of silicon oxide, but not limited thereto.

Figure 2:
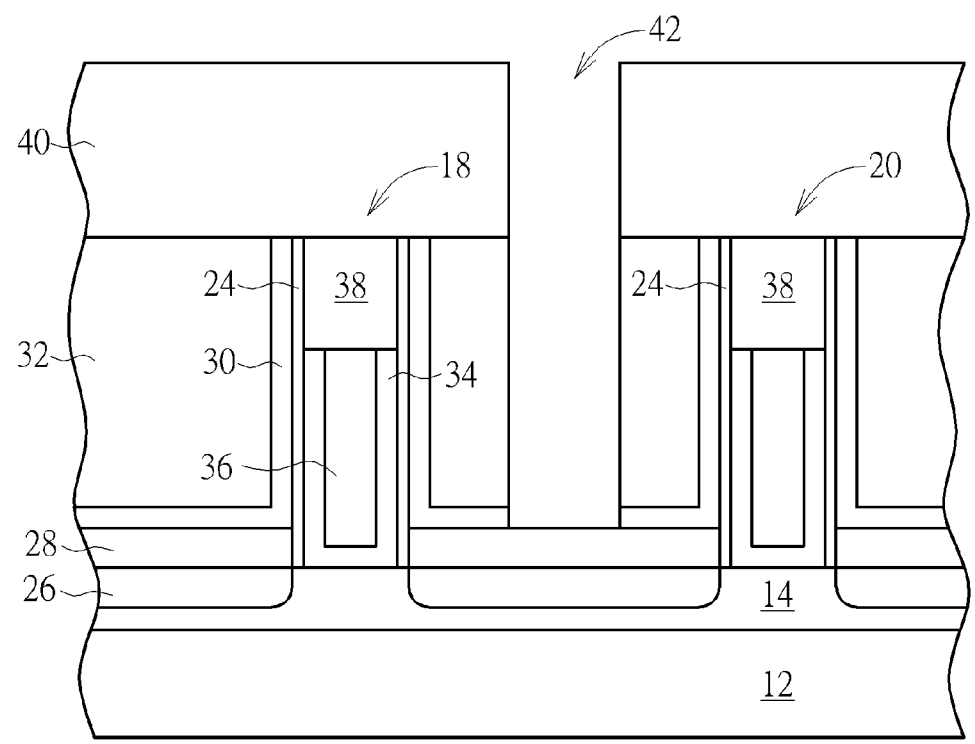

Next, as shown in FIG. 2, an opening 42 or contact hole is formed in the dielectric layer 40, the ILD layer 32, and the CESL 30 to expose the epitaxial layer 28.

Figure 3:
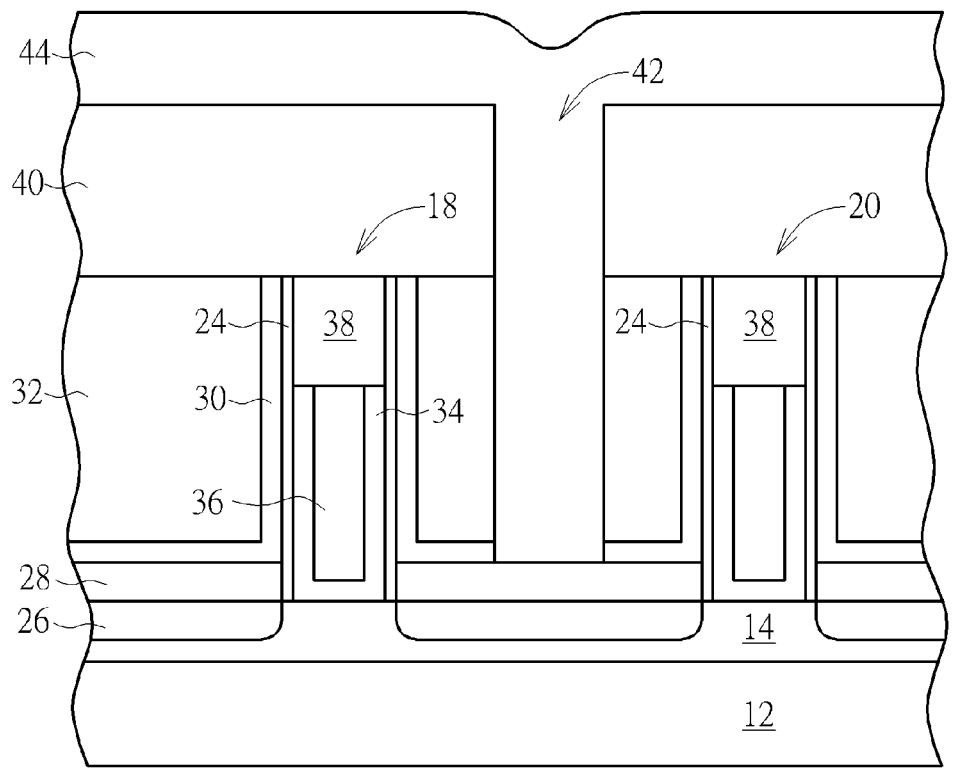

Next, as shown in FIG. 3, an organic dielectric layer (ODL) 44 is formed on the dielectric layer 40 and into the opening 42.

Figure 4:
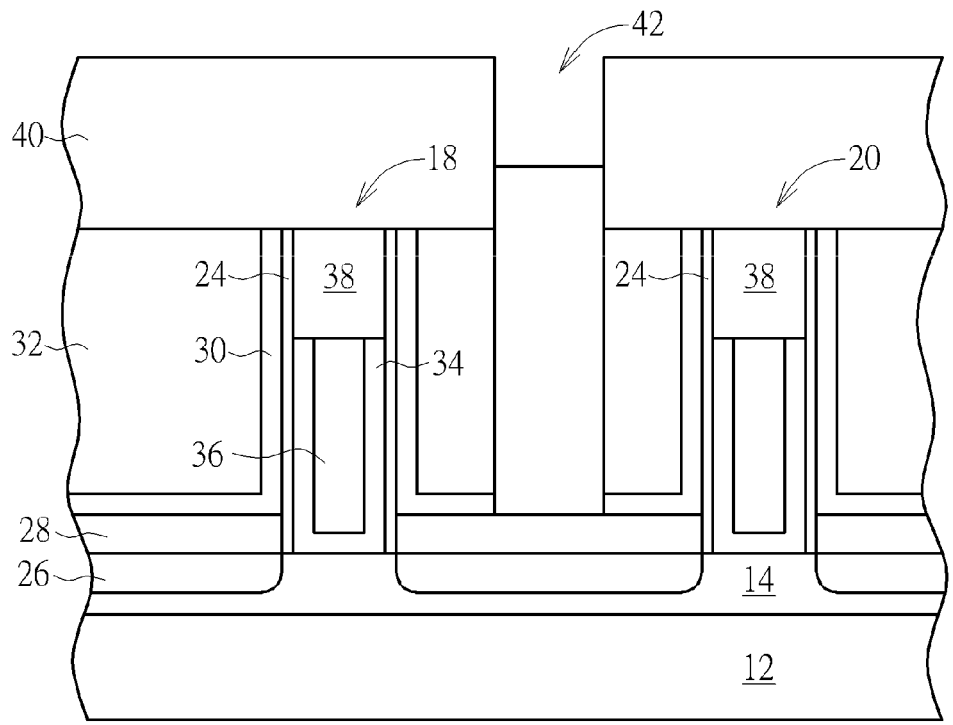

Next, as shown in FIG. 4, an etching back is conducted to remove part of the ODL 44 on the dielectric layer 40 so that the top surface of the remaining ODL 44 is preferably between the top and bottom surfaces of the dielectric layer 40.

Figure 5:
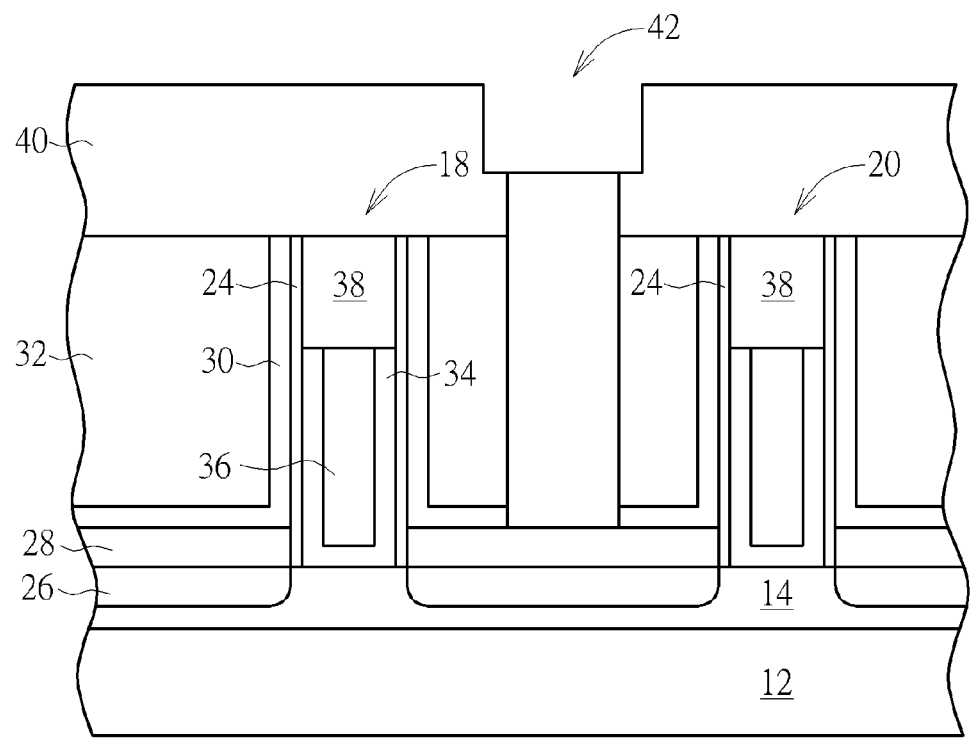

Next, as shown in FIG. 5, an isotropic etching process or wet clean is conducted to extend the opening 42 by removing part of the dielectric layer 40 in both horizontal and vertical direction. In this embodiment, the isotropic etching process is preferably accomplished by using SiCoNi as etchant while the wet clean is preferably accomplished by using diluted hydrofluoric acid (DHF) as the cleaning agent, but not limited thereto.

Figure 6:
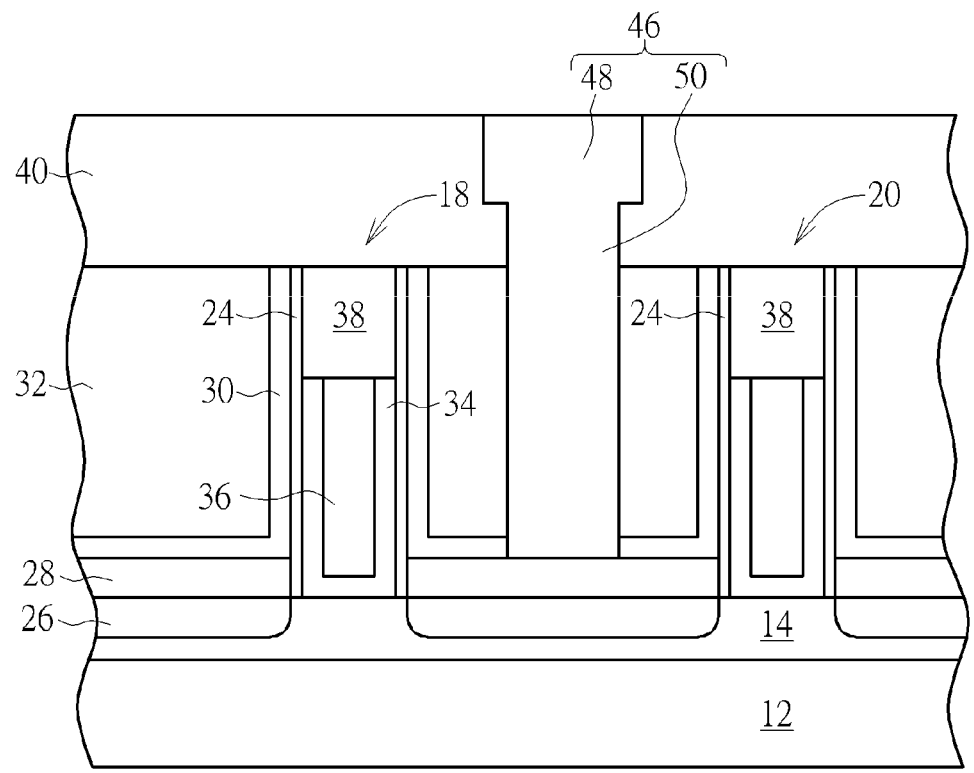

Next, as shown in FIG. 6, the remaining ODL 44 is removed entirely to reveal an opening 42 containing one trench opening and one via opening, and metal materials are deposited into the opening 42 and a planarizing process such as chemical mechanical polishing (CMP) is conducted thereafter to remove part of the metal material for forming a contact plug 46 in the opening 42, in which the contact plug 46 preferably includes a trench conductor 48 and a via conductor 50. Since the fabrication of contact plugs is well known to those skilled in the art, the details of which is not explained herein for the sake of brevity. After the contact plug 46 is formed, another planarizing process, such as CMP process is conducted to remove part of the dielectric layer 40 and the trench conductor 48 entirely to expose the via conductor 50. This completes the fabrication of a semiconductor device according to a preferred embodiment of the present invention.

Figure 7:
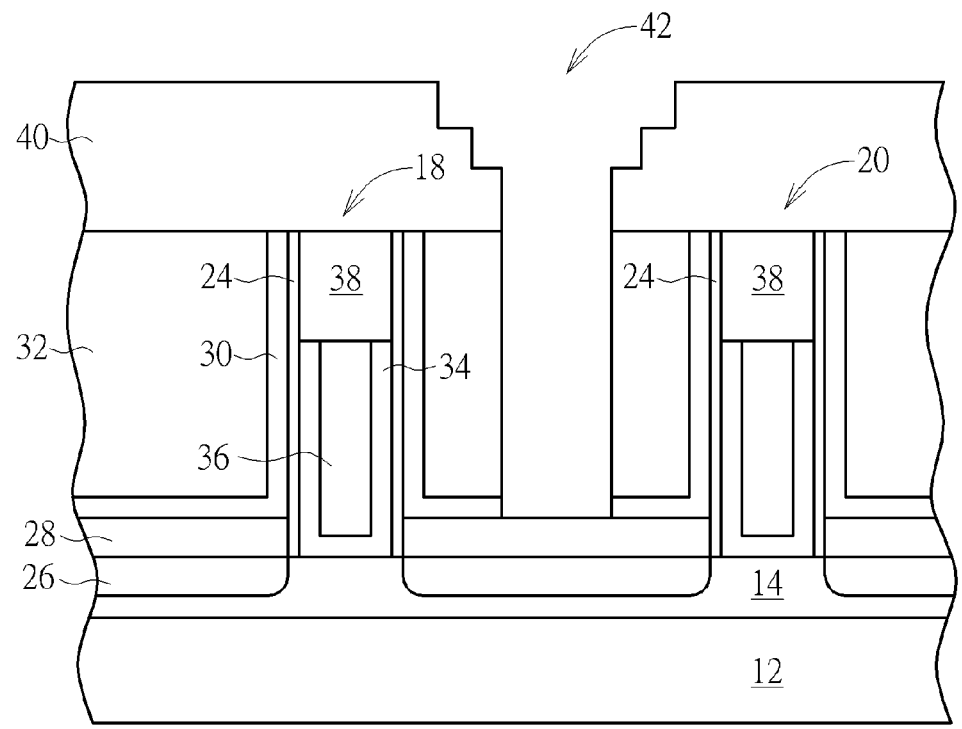
FIG. 7 illustrates a perspective view for fabricating semiconductor device according to an embodiment of the present invention.

Referring to FIG. 7, which illustrates a perspective view for fabricating semiconductor device according to an embodiment of the present invention. As shown in FIG. 7, instead of forming one single trench opening and one single via opening before depositing metals into the opening 42 as revealed in FIGS. 5-6, it would also be desirable to repeat the steps from FIGS. 3-5 to form a dielectric layer 40 with step-shaped profile before depositing metal materials into the opening 42 for forming contact plug, which is also within the scope of the present invention.

Figure 8:
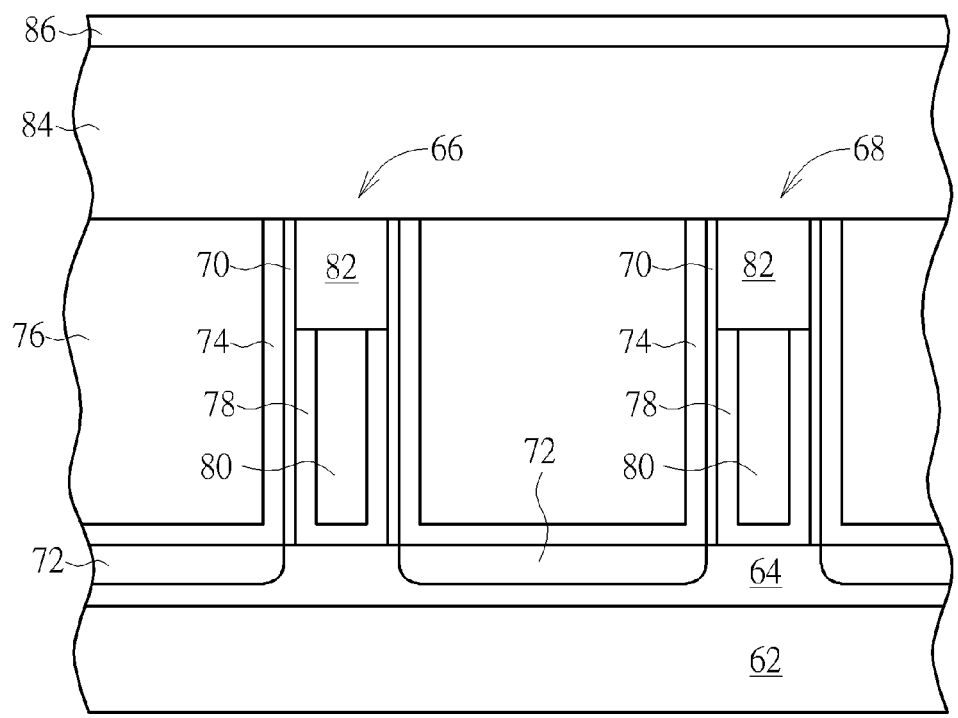
FIGS. 8-12 illustrate a method for fabricating semiconductor device according to another embodiment of the present invention.

Referring to FIGS. 8-12, FIGS. 8-12 illustrate a method for fabricating semiconductor device according to another embodiment of the present invention. As shown in FIG. 8, a substrate 62, such as a silicon substrate or silicon-on-insulator (SOI) substrate is provided. A fin-shaped structure 64 and an insulating layer (not shown) are formed on the substrate 62, in which the bottom of the fin-shapes structure 64 is preferably enclosed by the insulating layer, such as silicon oxide to form a shallow trench isolation (STI). A plurality of gate structures 66 and 68 is formed on part of the fin-shaped structure 64.

The fabrication of the gate structures 66 and 68 could be accomplished by a gate first process, a high-k first approach from gate last process, or a high-k last approach from gate last process. Since this embodiment pertains to a high-k first approach, dummy gates (not shown) composed of high-k dielectric layer and polysilicon material could be first formed on the fin-shaped structure 64 and the insulating layer, and a spacer 70 is formed on the sidewall of the dummy gates. A source/drain region 72 and epitaxial layer (not shown) are then formed on the fin-shaped structure 64 and/or substrate 62 adjacent to two sides of the spacer 70, a contact etch stop layer (CESL) 74 is formed on the dummy gates, and an interlayer dielectric (ILD) layer 76 composed of tetraethyl orthosilicate (TEOS) is formed on the CESL 30.

Next, a replacement metal gate (RMG) process could be conducted to planarize part of the ILD layer 76 and CESL 74 and then transforming the dummy gate into metal gates, in which the resulting metal gates preferably includes a U-shaped work function metal layer 78 and a low resistance metal layer 80. Preferably, the formation of the fin-shaped structure 64, the gate structures 66 and 68 could be accomplished by the same process disclosed in the aforementioned embodiment, and the details of which are not explained herein for the sake of brevity.

After forming the gate structures 66 and 68, part of the work function metal layer 78 and low resistance metal layer 80 could be removed and a hard mask 82 is formed on the work function metal layer 78 and the low resistance metal layer 80. The hard mask 82 could be a single material layer or composite material layer, such as a composite layer containing both silicon oxide and silicon nitride. A dielectric layer 84 and another hard mask 86 are then formed sequentially on the ILD layer 76 and the gate structures 66 and 68, in which the dielectric layer 84 and the hard mask 86 are preferably composed of different material. For instance, the dielectric layer 84 of this embodiment could be composed of silicon oxide while the hard mask 86 could be composed of silicon nitride, but not limited thereto.

Figure 9:
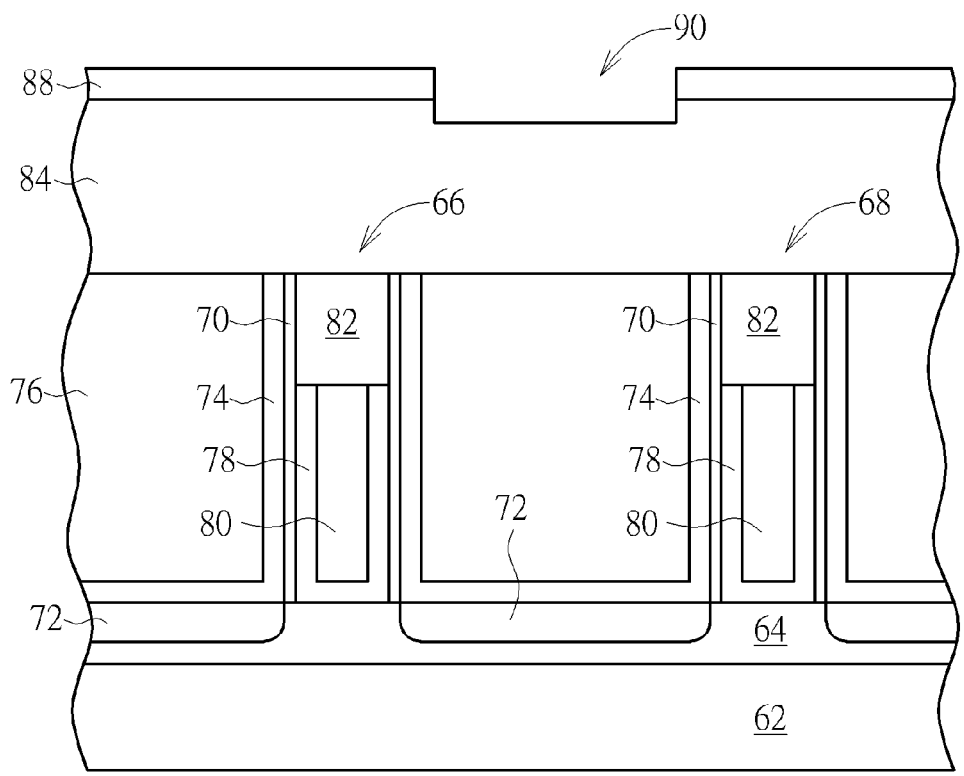

Next, as shown in FIG. 9, a photo-etching process is conducted by first forming a patterned resist (not shown) on the hard mask 86, and an etching process is carried out to remove part of the hard mask 86 and part of the dielectric layer 84. This forms a patterned hard mask 88 on the dielectric layer 84 while forming an opening 90 exposing part of the dielectric layer 84 surface.

Figure 10:
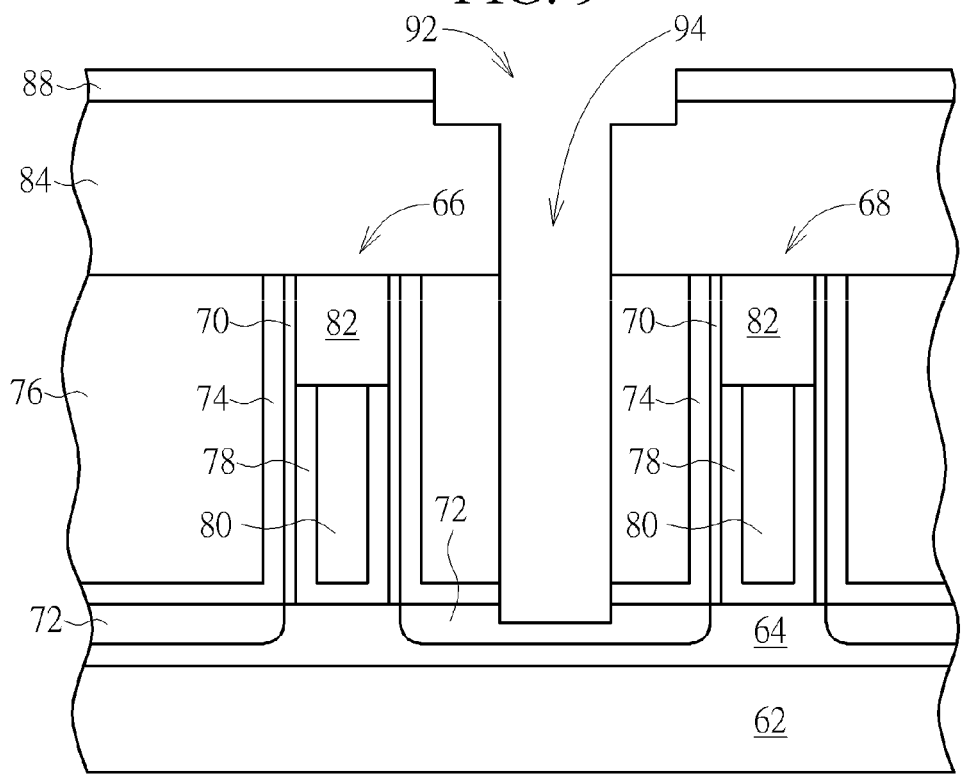

Next, as shown in FIG. 10, another photo-etching process is conducted by forming another patterned resist (not shown) on the patterned hard mask 88 and the dielectric layer 84, and an etching process is conducted to remove part of the dielectric layer 84 and part of the ILD layer 76 for forming a trench opening 92 and a via opening 94.

Figure 11:
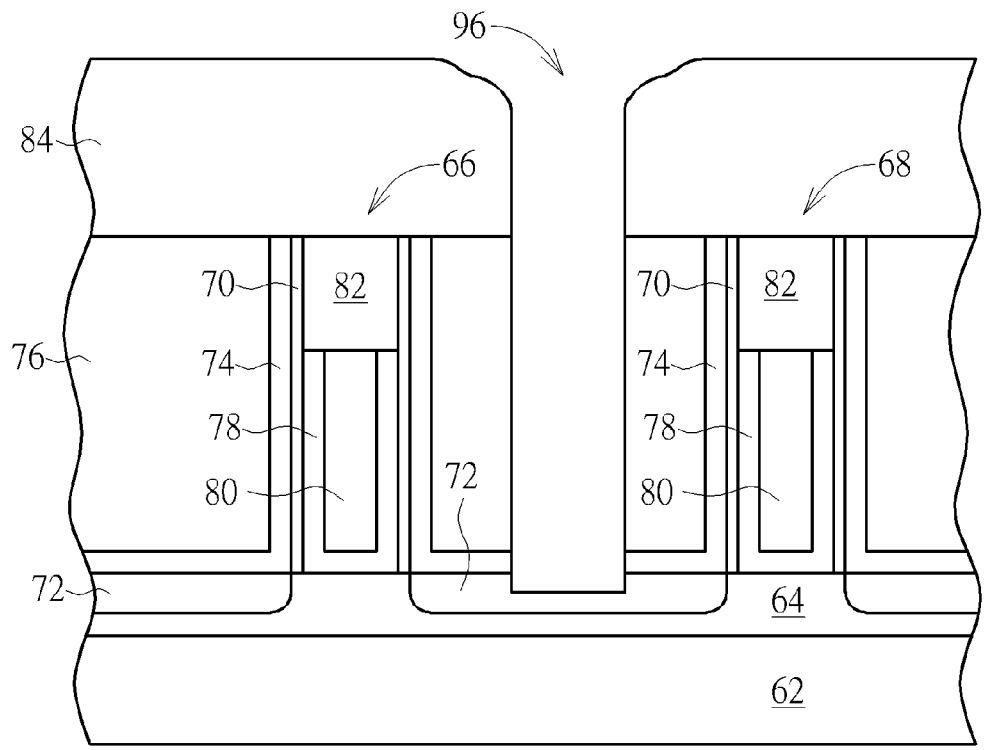

Next, as shown in FIG. 11, the patterned hard mask 88 is removed after the trench opening 92 and the via opening 94 are formed, and another etching process is conducted for rounding corners of the dielectric layer 84. In this embodiment, the etching process is preferably accomplished by utilizing a gas selected from the group consisting of SiCoNi and Ar to smooth corners of the dielectric layer 84 and as the step-shaped profile of the dielectric layer 84 becomes less pronounced, the trench opening 92 and via opening 94 are substantially jointed into one opening 96.

Figure 12:
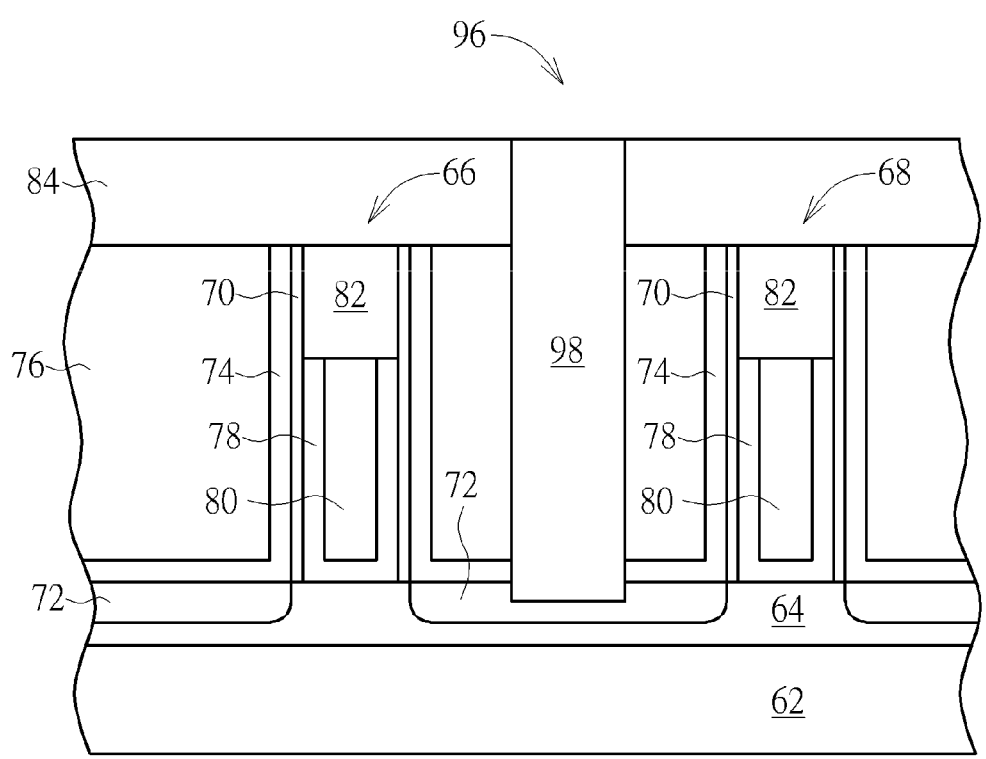

Next, as shown in FIG. 12, metal materials including barrier layer and conductive layer are deposited into the opening 96 and a planarizing process such as chemical mechanical polishing (CMP) is conducted thereafter to remove part of the metal materials and part of the dielectric layer 84 for forming a contact plug 98 in the opening 96. Preferably, the substantially rounded profile of the dielectric layer 84 is completely removed during the CMP process so that the top surface of the remaining dielectric layer 84 is even with the top surface of the contact plug 98. Since the fabrication of contact plugs is well known to those skilled in the art, the details of which is not explained herein for the sake of brevity. This completes the fabrication of a semiconductor device according to a preferred embodiment of the present invention.

Overall, the present invention discloses two novel approaches for forming contact plugs in the ILD layer after metal gates are fabricated. By using these new approaches as disclosed in the aforementioned embodiments to form contact plugs, phenomenon such as bowing profile typically found in contact holes could be eliminated and adhesion as well as gap-fill of the metal layers later to be deposited into the contact holes are also improved substantially.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    providing a substrate having a gate structure thereon and an interlayer dielectric (ILD) layer around the gate structure;
    forming a dielectric layer on the ILD layer and the gate structure;
    forming an opening in the dielectric layer and the ILD layer;
    forming an organic dielectric layer (ODL) on the dielectric layer and in the opening;
    removing part of the ODL;
    removing part of the dielectric layer for extending the opening;
    removing the remaining ODL; and
    forming a contact plug in the opening.

2. The method of claim 1, further comprising etching back part of the ODL by completely removing the ODL on the dielectric layer and part of the ODL in the opening.

3. The method of claim 1, further comprising performing an isotropic etching process or a wet clean to remove part of the dielectric layer for extending the opening.

4. The method of claim 3, further comprising utilizing diluted hydrofluoric acid (DHF) for performing the wet clean.

5. The method of claim 1, wherein the dielectric layer comprises silicon oxide.

6. The method of claim 1, wherein the contact plug comprises a trench conductor and a via conductor.

7. The method of claim 6, further comprising performing a planarizing process for removing part of the dielectric layer and the trench conductor.

* * * * *